United States Patent [19]

Brabetz

[11] 4,432,037
[45] Feb. 14, 1984

[54] MULTI-LAYER PRINTED CIRCUIT BOARD AND METHOD FOR DETERMINING THE ACTUAL POSITION OF INTERNALLY LOCATED TERMINAL AREAS

[75] Inventor: Bernhard Brabetz, Munich, Fed. Rep. of Germany

[73] Assignee: Siemens Aktiengesellschaft, Berlin & Munich, Fed. Rep. of Germany

[21] Appl. No.: 315,038

[22] Filed: Oct. 26, 1981

[30] Foreign Application Priority Data

Dec. 2, 1980 [DE] Fed. Rep. of Germany ....... 3045433

[51] Int. Cl.$^3$ .............................................. H05K 3/46
[52] U.S. Cl. ..................................... 361/410; 29/593; 174/68.5; 361/403; 361/414
[58] Field of Search ............... 174/68.5; 361/403, 410, 361/414; 29/593; 324/73 PC

[56] References Cited

U.S. PATENT DOCUMENTS

| 3,859,711 | 1/1975 | McKiddy | 174/68.5 X |
| 3,917,983 | 11/1975 | Kurinen | 361/414 |
| 4,048,438 | 9/1977 | Zimmerman | 174/68.5 |
| 4,049,903 | 9/1977 | Kobler | 174/68.5 |
| 4,164,003 | 8/1979 | Cutchaw | 361/403 |
| 4,208,783 | 6/1980 | Luther et al. | 29/593 |

OTHER PUBLICATIONS

T. E. Wray, Broken (Missing) Drill Detection, IBM Tech Disc. Bull., vol. 25, #1, Jun. 1982, pp. 291 & 292.
R. H. Franklin, Drilling of Multilayer Substrates with Laminated Foil Interfaces, IBM Tech. Disc. Bull., vol. 23, #8, p. 3800.

*Primary Examiner*—R. R. Kucia
*Attorney, Agent, or Firm*—Hill, Van Santen, Steadman & Simpson

[57] ABSTRACT

A method and apparatus for locating terminal points on an internal conductive layer on an internal board section of a multi-layer printed circuit board assembly. Conductive locating patterns are arranged on the internal board section which are preferably fabricated by the same fabrication technique as for the conductive layer. An electrical probe such as a metal drill is then employed to locate the conductive pattern relative to a reference point. Such information is then used for drilling holes through the internal terminal points.

9 Claims, 6 Drawing Figures

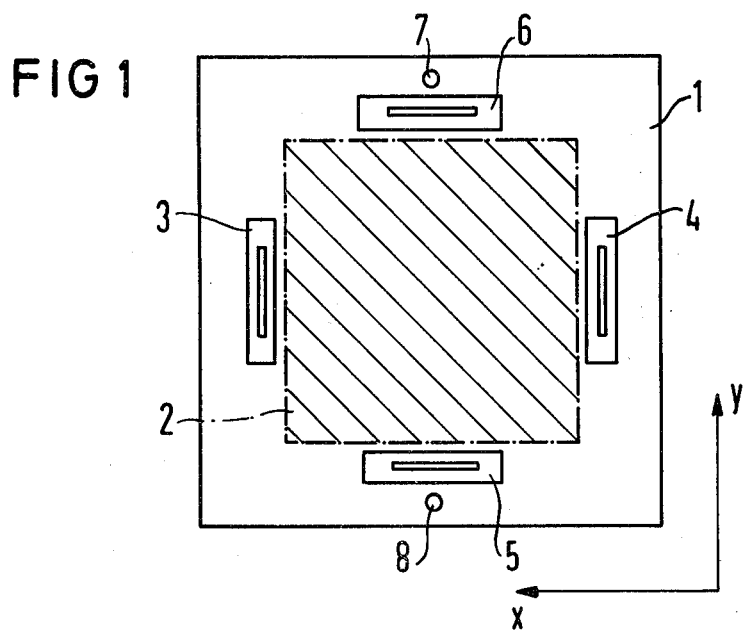
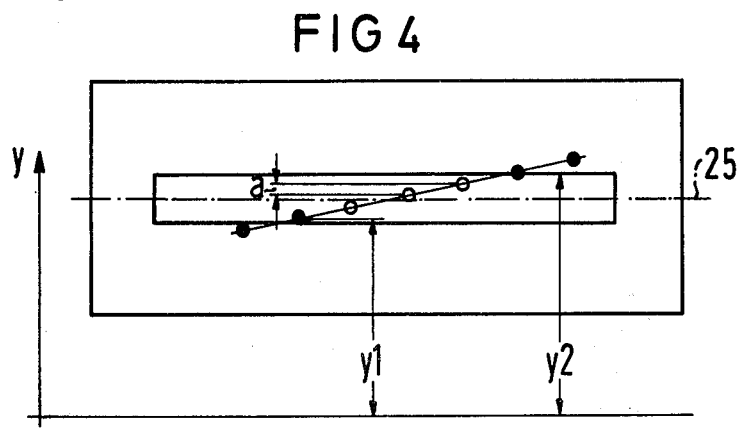

MULTI-LAYER PRINTED CIRCUIT BOARD AND METHOD FOR DETERMINING THE ACTUAL POSITION OF INTERNALLY LOCATED TERMINAL AREAS

BACKGROUND OF THE INVENTION

The invention relates to multi-layer printed circuit boards and a method for determining the actual position of internally disposed terminal areas on the individual conductive layers of pressed together sheet-like board sections forming the multi-layer printed circuit boards.

One of the most important work steps in the manufacture of multi-layer printed circuit boards is the drilling of the terminal holes for the metallic through-connections. In order to guarantee electrical functioning, the electric safety, as well as the reliability of the multi-layer printed circuit board product, these bores must lie within specified tolerances relative to the internally disposed or located terminal areas (e.g. eyelets) on the signal layers as well as relative to the internally disposed etching free areas on the potential layers.

Such tolerance demands are necessary since, in the fabrication process, the printed circuit boards printed with the pattern elements are drilled at the intersection points of the grid field, whereby, for this purpose, most frequently numerically controlled drilling machines, for example, multi-spindle drilling machines, are employed. In relation to the drilling spindles of these drilling machines the printed circuit board is moved by grid steps and drilled. The bores are to be positioned precisely in the center of the eyelets, for example. It is not permissible to fall below specific minimum distances between the bore wall and the free etching border. Moreover, the bore border cannot be permitted to leave the terminal area (e.g. eyelet).

Decisive for the position accuracy of the created bores is the more or less great correspondence of the position of the zero- or reference-point of the drilling machine—operating according to a predetermined program—within a coordinate system, and hence of the individual grid steps of the bore table with the position of the reference point in the specified nominal grid field.

Very narrow ranges are to be demanded, particularly in the case of multi-layer printed circuit boards, since a precise alignment in the various layers is a prerequisite for their usefulness. Knowledge as precise as possible with respect to the actual position of the internally disposed terminal areas, or free etchings, respectively, to a reference point (e.g. location hole) is a prerequisite for satisfying this requirement.

Up to the present time, in order to solve this problem the multi-layer printed circuit board has been processed by use of an alignment or fitting system. The fitting or alignment system is disposed on each of the individual sheets or foils from which the multi-layer printed circuit board results. It consists of location holes which fix a reference point and a reference line from which the position determination of the conductive patterns on the individual sheets takes place. Also in the case of pressing the individual sheets, this fitting system is employed so that the conductive patterns of the individual inner layers following the pressing are disposed on a nominally known position relative to the location system. During drilling of the terminal holes their positioning like-wise takes place in relation to the fitting system, whereby, in most instances, the nominal position of the internally disposed conductive patterns relative to the fitting or alignment system is employed during positioning of the terminal holes.

Since the actual position of the internally disposed conductive patterns does not correspond to the normal position due to fabrication errors and changes in length, in this manner the allocation of the terminal holes to the internally disposed conductive patterns is associated with errors. Therefore, at times the attempt is also made to ascertain the difference between actual position and nominal position prior to the drilling directly on the work-piece (the pressed part) and to then correspondingly correct the drilling pattern. The known methods for determining the actual position (e.g. X-raying) operate with an accuracy of ±0.1 mm or greater. During the working of highly miniaturized conductive patterns, however, accuracies in the mm-range are required.

SUMMARY OF THE INVENTION

An object underlying the invention consists in designing the printed circuit boards in such manner that a determination of the actual position of the internally disposed terminal areas of the individual layers of pressed sectional parts is possible, and lying within required accuracy ranges. Moreover, through the invention, a method for determining the actual position of the internally disposed conductive patterns with correspondingly designed printed circuit boards is outlined.

This is achieved in accordance with the invention since each core of a multi-layer printed circuit board exhibits at least one test region or pattern in strip form in addition to the conductive pattern. This test pattern is a component which is created during fabrication of the conductive pattern. This design of the internal sections permits a determination of the actual position of the internally disposed conductive patterns for each pressed together section, for example on a numerically controlled drilling machine directly prior to the drilling of the terminal holes. With the application of test patterns it is possible that each position change of the conductive patterns, which are e.g. caused by distortions during pressing, have a similar effect in the test patterns and can be determined with the aid of the test patterns.

According to a further development of the invention the test patterns consist of a strip of conductive sheet or foil in which an etching free groove is arranged. The symmetrical design of the test pattern has the advantage that defects of form, which are caused by over-etching or under-etching of the conductive pattern, do not have an effect on the position of the center of the etching free groove and thus have no influence on the position information.

Instead of the etching free groove, in accordance with a further design of the invention, a region covered with conductive sheet material or foil can be provided whose surroundings are free of conductive sheet material or foil. Also in the case of this embodiment it is a question of a symmetrical design in which the center of the conductive sheet or foil is determined.

In accordance with a further development of the invention two or more test patterns per coordinate direction and conductive pattern are provided. It is thereby possible to directly interrogate or sample in their position those particular interior layers which have the highest tolerance requirements with the aid of their test patterns.

In accordance with a further development of the invention the test patterns are arranged along and as close as possible to the exterior contours of the conductive patterns.

The inventive method for the determination of the actual position of internally disposed terminal areas of the individual layers of pressed parts with correspondingly designed printed circuit boards utilizes staggered test bores positioned in the test pattern to determine the center of the etching free groove relative to a reference point through observation of the electric contact between drill and internal layer. This has the advantage that the evaluation takes place in the same mounting or setting of the printed circuit board on the drilling machine in which also the through contacting bores produced subsequent to the evaluation. It is thereby achieved that fitting errors or defects which occur during the mounting have no effect.

According to a further embodiment of the method, the position of the test bores is electrically interrogated or sampled. In this manner it is possible to process the interrogation or sampling results on-line with the aid of an evaluation electronics and to input it into a machine control.

According to the inventive method, the internal layers are evaluated individually or in freely determinable groups. In this manner it is possible to individually interrogate the internal layer which exhibits the greatest tolerance demand.

The invention shall be explained on the basis of the figures.

BRIEF DESCRIPTION OF THE DRAWINGS

FIG. 1 illustrates the internal layer of an internal section with four test patterns;

FIGS. 2 and 3 illustrate two design possibilities of the test patterns;

FIG. 4 illustrates a test pattern with bores arranged in a staggered fashion.

DESCRIPTION OF THE PREFERRED EMBODIMENTS

Figure 5:
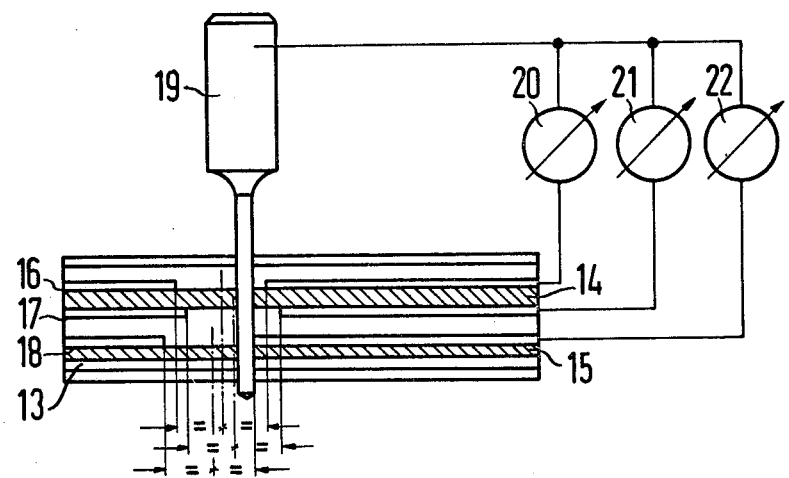
FIGS. 5 and 6 illustrate determination of the actual position per internal layer on two sample embodiments.

In FIG. 1, which shows the judicious arrangement and design of test patterns, 1 designates a board section of the multi-layer P C board. In the region 2, which is bordered by dots and dashes, a conductive pattern indicated with hatching is provided on the internal or core board section 1. In addition to the conductive pattern, as sample embodiments two test patterns 3, 4 for the determination of the actual position in an X-direction are arranged. The test patterns 5, 6 serve the purpose of determinating the actual position in the Y-direction. In order to mount or set the later laminate during boring, location holes 7, 8 are provided.

According to FIG. 2, a test pattern consists e.g. of a region covered with a conductive sheet or foil 9 in which an etching free groove or space 10 is arranged. According to the inverse embodiment according to FIG. 3, the etching free groove 10 becomes a region 11 covered with a conductive sheet or foil, whose surrounding border 12 is free of the conductive sheet or foil.

FIG. 4 illustrates in enlarged fashion one of the test patterns, for example 5, for the determination of the position in the Y-direction. "a" indicates the size of the position staggering in the Y-direction.

Figure 6:
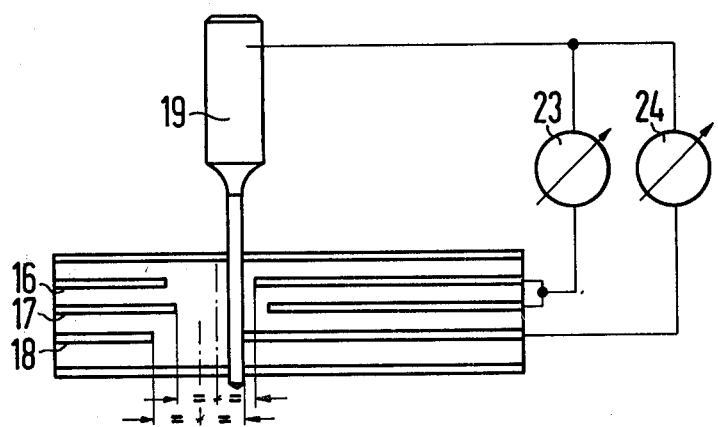

In FIGS. 5 and 6, the determination of the actual position per internal layer is illustrated. 13 designates in each instance a pressed together section which, for example according to FIG. 5, encloses initial core sections 14 and 15. The section 14 exhibits an internal layer 16 and 17, and the core section 15 exhibits an internal layer 18. A drill 19 according to FIG. 5 is connected with the internal layers via resistance measurement units 20, 21, 22. According to FIG. 6, the internal layers 16 and 17 are combined, so that only two resistance measuring units 23 and 24 are necessary. The resistance measurement units must be suited for the brief display of signals.

Immediately prior to the drilling of terminal holes, test bores are placed in the locating pattern. It is here monitored whether the drill comes into electrical contact with the conductive region of the test patterns (FIGS. 5 and 6). Through a freely selectable staggering by the amount "a" of the position of the test bores, the distance of the center of the etching free space or region 10 of the test pattern can in this manner be determined relative to a reference point (e.g. machine zero point or locating hole). The size of the position staggering "a" of the test bores determines the accuracy with which the actual position of the center of the etching free groove can be ascertained. According to the representation in FIG. 4, the position of the center of the etching free space or region 25 is displayed with an accuracy of $\leq \frac{1}{2}a$. The y-position of the etching free region is $\frac{1}{2}$ (y1+y2). In producing the bores illustrated as a black point in the drawing, the drill comes into electrical contact with the conductive region of the test pattern. In producing the bores illustrated in the drawing by the small circle, the drill does not come into electric contact with the conductive region of the test pattern.

If one arranges two test patterns for each coordinate direction and conductive pattern, and actual distance of the test patterns to one another can be calculated after the determination of their actual position. In arranging the test patterns along the exterior contours of the conductive pattern (FIG. 1), in addition to the actual position, in this manner also the actual size of the conductive pattern per internal layer can be determined.

Through a suitable selection of the electrical interrogation or sampling procedures, it is possible to interrogate or sample the test patterns for each internal layer or for random internal layer groups (FIGS. 5 and 6).

After determination of the actual positions of the test patterns of the pressed sections in a prior drilling step, the terminal holes can be introduced in the same mounting or setting corresponding to these results. Depending upon requirements, their positioning can now be matched for a specific individual layer, an individual layer group, or the cited internal layer combinations. This takes place on drilling machines in the control through zero point displacement and/or through the application of a scale factor. The individual drilling coordinates are multiplied with a factor at both axes. It is thus possible to conduct linear length changes of the drilling grid.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A multi-layer printed circuit board alignment system, comprising: a plurality of board sections including an internal board section having a conductive circuit layer thereon which includes an internally disposed terminal area formed in the circuit layer; at least one test pattern on said internal board section in addition to the conductive circuit layer which is fabricated in a manner similar to fabrication of the circuit layer, said test pattern comprising an electrically conductive locating pattern adapted for sensing by an external electrical probe, and said external electrical probe comprising a conductive drill means for making a plurality of test bores in a given pattern having a predetermined constant spacing between adjacent bores so as to determine a deviation distance of a point to said locating pattern from a given reference point by a tolerance determined by said predetermined constant spacing.

2. A multi-layer printed circuit board system according to claim 1 wherein the test patterns are comprised of a conductive region in which an etching free space is arranged.

3. A multi-layer printed circuit board system according to claim 1 wherein the conductive region comprises a rectangular conductive strip having an etching free space surrounding the strip.

4. A multi-layer printed circuit board system according to claim 1 wherein two test patterns are provided, one along one edge of the board section and another along an edge perpendicular to said edge.

5. A multi-layer printed circuit board system according to claim 4 wherein each test pattern comprises a conductive rectangular strip.

6. A multi-layer printed circuit board system according to claim 1 wherein at least two test patterns, one for an X-coordinate direction and another for a Y-coordinate direction, are provided on the internal board section.

7. A multi-layer printed circuit board system according to claim 1 wherein the test patterns are arranged outside of and adjacent to contours of the conductive circuit layer on the internal board section.

8. A multi-layer printed circuit board system, comprising: a plurality of circuit board sections including at least one internal board section having a conductive circuit layer thereon; on the internal board section at least two conductive test patterns corresponding to x and y coordinates positioning the board; said test patterns being adapted for sensing by an external electrical probe which senses for a non-conducting or conducting region within the pattern; and said external electrical probe comprising a conductive drill means for making a plurality of test bores in a linear pattern having a predetermined constant spacing between adjacent bores so as to determine a deviation distance of a central point in said locating pattern from a given reference point by a tolerance determined by said predetermined constant spacing.

9. A system according to claim 8 wherein the test pattern is rectangular and the drill means makes a linear pattern which crosses a narrow portion of the rectangular pattern at an angle.

* * * * *